United States Patent [19]

Rugg

[11] Patent Number: 5,477,467
[45] Date of Patent: Dec. 19, 1995

[54] SHRINKABLE BICMOS CIRCUIT LAYOUT

[75] Inventor: James M. Rugg, Mesa, Ariz.

[73] Assignee: Motorola, Inc., Schaumburg, Ill.

[21] Appl. No.: 891,902

[22] Filed: Jun. 1, 1992

Related U.S. Application Data

[63] Continuation of Ser. No. 380,559, Jul. 17, 1989, abandoned.

[51] Int. Cl.⁶ .................................................... G01F 17/50
[52] U.S. Cl. ............................................. 364/490; 364/491
[58] Field of Search .................................. 364/488, 489, 364/490, 491; 257/370, 586

[56] References Cited

U.S. PATENT DOCUMENTS

| | | | |
|---|---|---|---|
| 4,827,428 | 5/1989 | Dunlop et al. | 364/491 |
| 4,897,703 | 1/1990 | Spratt et al. | 257/586 |
| 4,912,055 | 3/1990 | Min et al. | 257/370 |
| 4,985,744 | 1/1991 | Spratt et al. | 257/370 |
| 5,119,314 | 6/1992 | Hotta et al. | 364/491 |
| 5,231,590 | 7/1993 | Kumar et al. | 364/491 |

OTHER PUBLICATIONS

"Introduction to MOS LSI Design" by J. Mavor et al., Addison–Wesley Publishing Company, 1983, pp. 2, 7–8 and 81–85.

"Automatic Sizing of Power/Ground (P/G) Networks in VLSI" by Dutta et al., IEEE/ACM 26th Design Automation Conference, 1989, pp. 783–786.

*Primary Examiner*—Vincent N. Trans
*Attorney, Agent, or Firm*—Joe E. Barbee; Bruce T. Neel

[57] ABSTRACT

A BiCMOS integrated circuit design having an oversized isolation area surrounding circuit elements which are non-scaleable is provided. The non-scaleable circuit elements can be removed from the layout, and the remaining scaleable elements shrunk by a CAD system. After shrinking the scaleable elements and the isolation area, the non-scaleable elements are returned to the layout at their original size, and located within the scaled-down isolation area.

11 Claims, 2 Drawing Sheets

SHRINKABLE BICMOS CIRCUIT LAYOUT

This application is a continuation of prior application Ser. No. 07/380,559, filed Jul. 17, 1989, abandoned.

BACKGROUND OF THE INVENTION

The present invention relates, in general, to integrated circuit design, and in particular to a shrinkable integrated circuit design for circuits having both bipolar and CMOS circuit elements.

Integrated circuits take months or years to design, and due to advancements in process technology, the design may become obsolete soon after the design is complete. In the past, when new process technology allowed manufacturers to produce circuits with smaller dimensions, the integrated circuit had to be re-designed or redrawn to implement the smaller dimension. Often the redesign took several months. Circuit designs, or layouts, are usually done on a computer aided design (CAD) system, which processes a digital record of the layout. In order to reduce redesign time, CAD systems are used to arithmetically shrink the layout, also called scaling the design. While scaling works very well for some circuit elements, such as CMOS elements and passive components, it works poorly on others, such as bipolar elements. This is because parameter changes in CMOS elements and passive components are roughly linear with size, while bipolar elements change non-linearly. To take advantage of smaller dimensions in a bipolar circuit each transistor was redesigned, not simply scaled, and often times circuit changes were made to compensate for the parametric changes of the bipolar transistors. Scaleable circuits enjoy a longer product lifetime, and are more cost effective than non-scaleable circuits.

Recently, integrated circuits have become available having both CMOS and bipolar elements formed on a single shared substrate. These circuits are called BiCMOS circuits and comprise CMOS devices built in the substrate, and bipolar cells which are formed in areas which are isolated from the the CMOS devices. The boundary of the isolation area is usually spaced as near to an outside edge of the bipolar cell as possible, and the spacing is substantially uniform for each bipolar cell on a chip. The isolation spacing, which is the separation between the boundary of the isolation area and the outside edge of the bipolar cell, is a function of a minimum geometry drawn in the circuit, as well as peak voltage which is applied to the circuit. For example, minimum isolation spacing for three micron minimum geometry circuits is typically 12–15 microns, and isolation spacing for sub-micron minimum geometry is three to four microns. In general, the minimum isolation spacing is frequently about four to five times the minimum geometry of the circuit.

While large portions of BiCMOS circuits are scaleable, manufacturers have faced the same redesign problem with BiCMOS circuits as with bipolar circuits. Because many of the bipolar elements required redesign, not just scaling, the time delay to take advantage of new process technology was excessively long. Bipolar cells were redesigned to smaller geometries when possible, and when this was not possible, the surrounding isolation region and CMOS circuitry were redesigned to fit around the original bipolar cell.

Accordingly, it is an object of the present invention to provide a bipolar-CMOS circuit which is scaleable.

It is a further object of the present invention to provide a method for laying out a BiCMOS circuit which anticipates future process improvements.

It is another object of the present invention to provide a BiCMOS integrated circuit which can be scaled by a CAD system with minimal redesign.

It is a further object of the present invention to provide a faster method for shrinking BiCMOS integrated circuits.

It is a still further object of the present invention to provide a BiCMOS integrated circuit with a longer product lifetime.

SUMMARY OF THE INVENTION

These and other objects and advantages of the present invention are achieved by providing a BiCMOS integrated circuit design having an oversized isolation area surrounding circuit elements which are non-scaleable, so that the non-scaleable circuit elements can be removed from the layout, and the remaining scaleable elements arithmetically scaled by a CAD system. After shrinking the scaleable elements and the isolation area, the non-scaleable elements are returned to the layout at their original size, and located within the scaled-down isolation area.

DETAILED DESCRIPTION OF THE DRAWINGS

Figure 1:
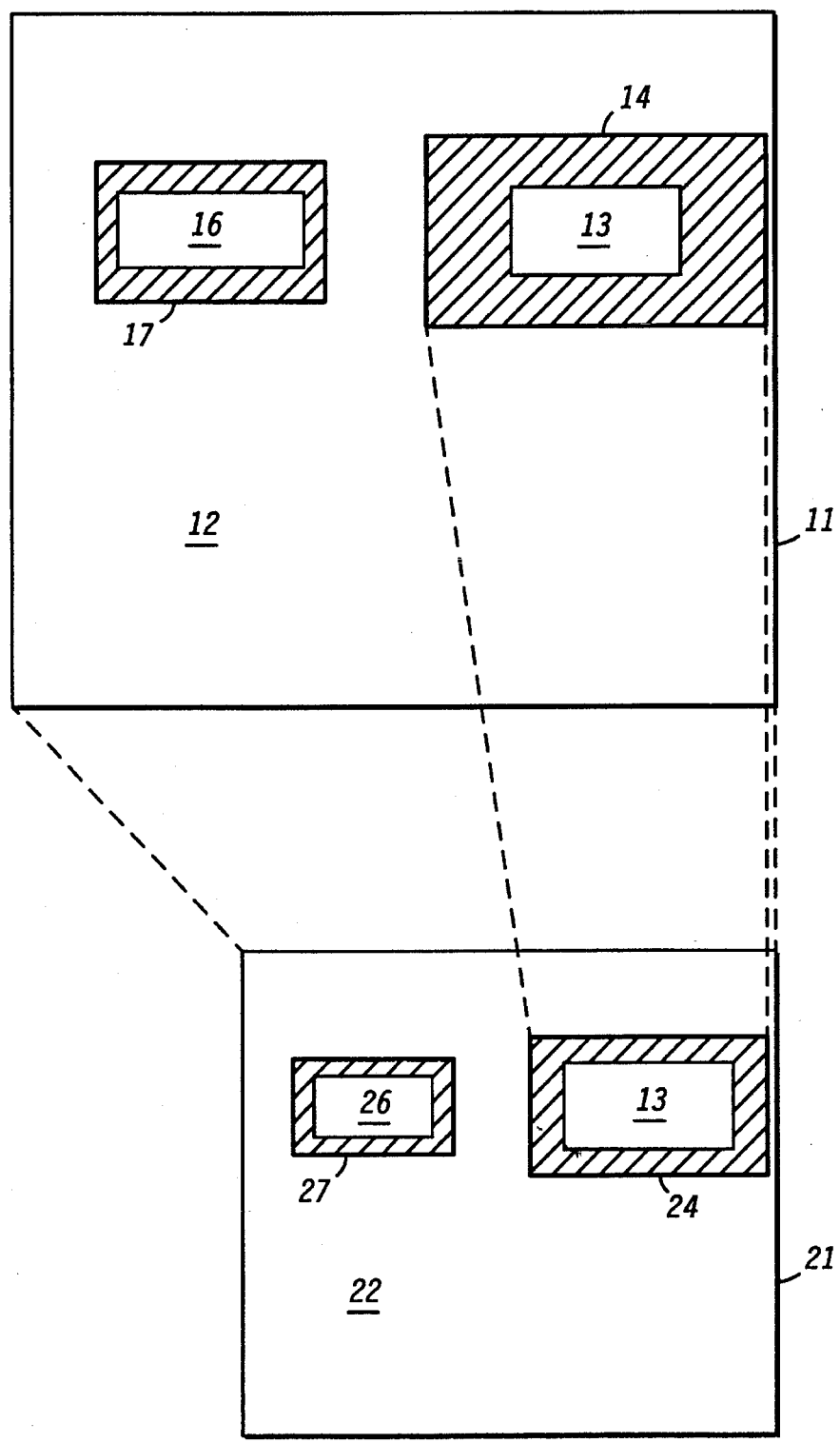
FIG. 1 illustrates a comparison of a portion of a BiCMOS circuit of the present invention before and after a circuit shrink.

FIG. 1 illustrates a comparison of a portion of a BiCMOS circuit using the present invention. While the present invention is particularly applicable to BiCMOS designs, it should be understood that the method can be applied to any circuit in which a portion of the circuit cannot be scaled down, such as analog/digital circuits, sensors, or the like. First generation layout 11 comprises CMOS circuit area 12, non-critical bipolar cell 16 and critical bipolar cell 13. Non-critical bipolar elements are elements which do not effect circuit performance when they are down sized, even though they experience parametric change, as does critical bipolar cell 13. Non-critical Bipolar cell 16 has a width $W_{cell}$ and is formed inside isolation region 17. Isolation spacing $W_{min}$ is the minimum separation between the boundary of isolation region 17 and cell 16 used in a design to guarantee that current from bipolar cell 16 does not reach surrounding circuit elements, and is a function of cell geometry and peak voltage applied to the circuit. Bipolar cell 13 is formed inside oversized isolation region 14, which is oversized by a predetermined percentage. What is meant by oversized is that the isolation spacing of isolation region 14 is larger than the minimum isolation separation $W_{min}$ which surrounds non-critical bipolar cell 16. The amount of oversize is determined by estimating the lifetime of the circuit design, and the effects of process technology change on manufacturable dimensions during that lifetime. Typically, a design lifetime will be 5–10 years, and process technology may reduce manufacturable dimension by 30% to 50% in that lifetime. A buffer zone of electrically inactive space which uniformly surrounds bipolar cell 13 is created between the outside boundary of bipolar cell 13 and an outside edge of isolation region 14. First generation layout 11 thus has a uniform first isolation spacing around the scaleable components 16 and a second uniform isolation spacing around non-scaleable elements 13. Once first generation layout 11 is complete, photomasks are generated and production begins.

Second generation layout 21 comprises CMOS circuitry 22 and non-critical bipolar cell 26, which are identical to CMOS circuitry 12 and bipolar cell 16, except smaller. These smaller elements are achieved by using a CAD program to shrink or scale-down the elements. Isolation region 24 and 27 are down-sized by the same percentage as CMOS circuitry 22. Because isolation region 14 was oversized in first generation layout 11, enough area remains to replace bipolar cell 13 from first generation layout 11 into second generation layout 21, without shrinking cell 13. Bipolar cell 13 is centered in isolation region 24 so that isolation region 24 uniformly surrounds bipolar cell 13 in second generation layout 21, as isolation region 14 did in first generation layout 11. The size of the buffer zone decreases, but since the buffer zone is electrically inactive, shrinking does not effect performance of bipolar cell 13. Isolation region 14 is oversized so that the separation between bipolar cell 13 and an outside edge isolation region 24 is at least as large as the separation between bipolar cell 26 and an outside edge of isolation region 27. That is to say, even though isolation region 14 shrinks in second generation layout 21, it must meet the same spacing requirements as other components of second generation layout 21. CMOS circuit area 12 and isolation areas 14 and 17 can be scaled digitally on a CAD system in a few hours with minimal intervention or redesign. Once circuit area 22 and isolation areas 24 and 27 are drawn, bipolar cell 13 is copied from layout 11 at the original scale, and substituted into layout 21, with no redesign required. Photomasks are then generated from a digital record of layout 21 by the CAD system, and production of circuits using second generation layout 21 begins.

Figure 2:
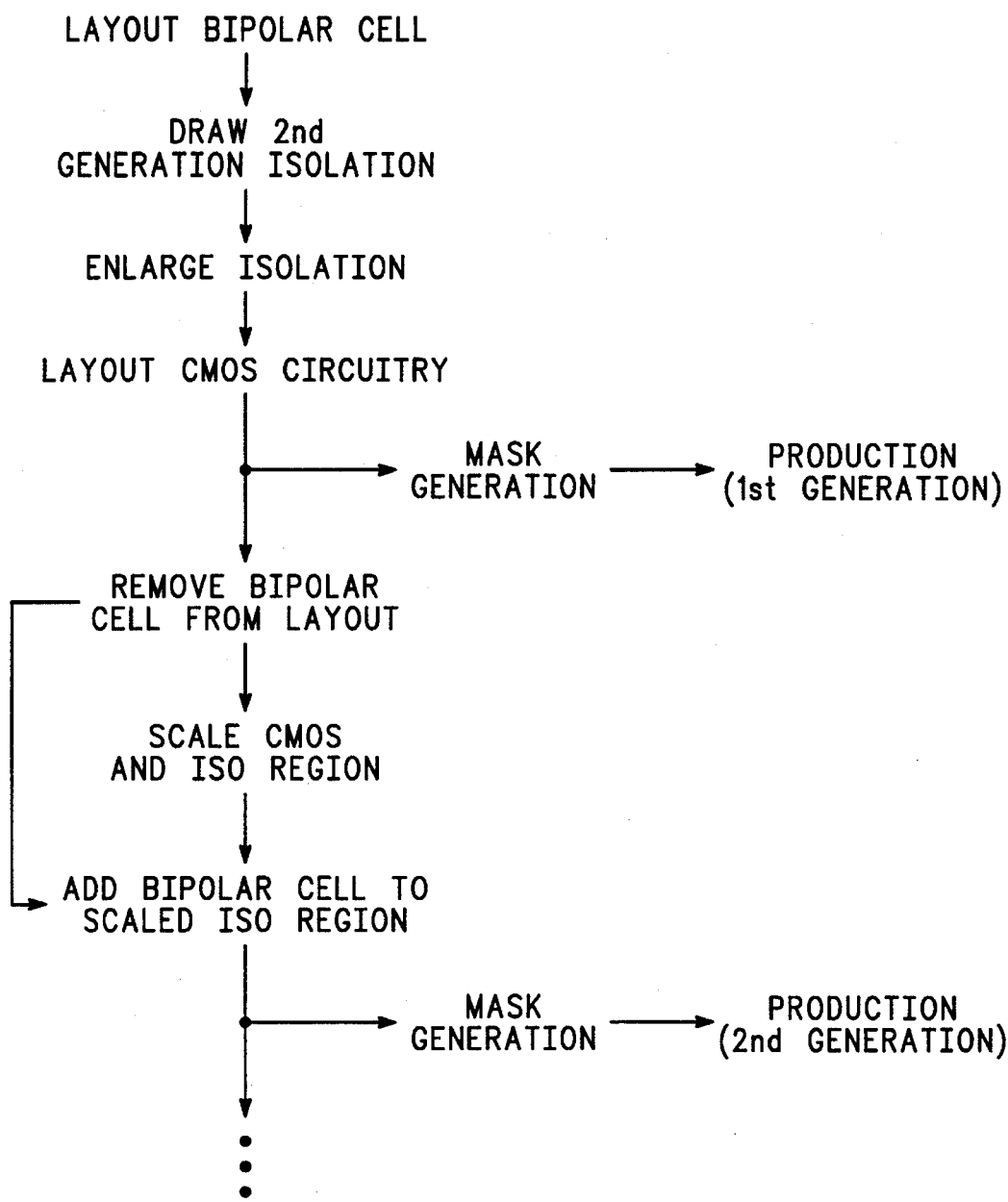
FIG. 2 illustrates a flowchart of a design and scaling sequence for a BiCMOS circuit of the present invention.

FIG. 2 illustrates a flowchart of the preferred process steps involved in shrinking layout 11 of FIG. 1. Critical bipolar cell 13 is drawn and isolation region 24 of second generation mask 21 is drawn around bipolar cell 13. It is not important to actually draw isolation region 24, but the dimensions of isolation region 24 must be determined from conventional design rules. Isolation region 14 is generated by enlarging isolation area 24 to account for future process improvements. For example, if a 30% scaling is desired, isolation area 14 is generated by a enlarging each side of isolation area 24 by $$\frac{1}{1-30\%}$$

or a factor of 1.43. More specifically, if $W_{min}$ is the minimum isolation spacing in second generation layout 21 and $W_{cell}$ is the width of cell 13, then the total width of isolation area 24 is $W_{tot2}=W_{cell}+2W_{min}$, and the total width of isolation area 14 is:

$$W_{tot1} = \frac{W_{tot2}}{1-30\%} = \frac{W_{cell}+2W_{min}}{1-30\%}$$

CMOS circuitry 12, non-critical bipolar cell 16 and isolation region 17 are simultaneously drawn outside of isolation area 14, completing first generation layout 11. Photomasks are made from first generation layout 11 and standard production follows.

When process improvements become available which allow for smaller dimensions to be used in production, layout 21 is generated. Preferably, bipolar cell 13 is removed from layout 11, and the remaining elements of layout 11, including isolation area 14, are scaled arithmetically. The resulting layout comprises scaled elements 22, 27, 26, and 24. Bipolar cell 13 is then substituted into isolation area 24 and centered with respect to the outside edges of isolation area 24. Photomasks are generated for the second generation layout by the CAD system, and second generation production can begin. Although first generation layout 11 is larger than necessary due to the increased size of isolation region 14, and may result in integrated circuits which cost more initially than a conventional layout, the reduced design time required to take advantage of processing improvements will result in a lower product cost over the lifetime of the design.

By now it should be appreciated that an integrated circuit is provided which is easily down scaled even when some elements of the integrated circuit cannot be down scaled. A first generation layout is drawn so that non-scaleable elements are placed as removeable cells in oversized isolation areas. The critical isolation areas in the first generation layout are sized in anticipation of future process improvements which allow smaller feature size of the scaleable circuit elements. The first generation layout can be down sized by removing the non-scaleable cells and arithmetically scaling the first generation layout using a CAD system. The non-scaleable cells are then placed into the down sized layout at their original size. In this manner, the integrated circuit can be arithmetically scaled by a CAD system, requiring minimal human intervention, and reducing the time required to shrink a design from several months to a few hours. Because the resulting circuit will be functionally equivalent to the original circuit, product lifetime is greatly extended, and product cost is reduced.

I claim:

1. An integrated circuit comprising: an isolation region; a first circuit type outside of the isolation region; a second circuit type inside the isolation region, wherein excess space is left between the periphery of the second circuit type and the boundary of the isolation region so that the first circuit type and the isolation region can be downsized without shrinking the second circuit type.

2. The integrated circuit of claim 1 wherein the first circuit type comprises bipolar circuitry and the second circuit type comprises CMOS circuitry, and the oversized excess space uniformly surrounds the isolation region.

3. A method of generating a digital record using a computer aided design (CAD) system providing the basis for a photomask of a scaleable integrated circuit having CMOS circuit elements and bipolar circuit elements, each of the bipolar circuit elements being surrounded by an isolation area, wherein a P% size reduction is anticipated for the CMOS circuit elements and the isolation areas have a minimum isolation width $W_{min}$, the method comprising the steps of: identifying scaleable and non-scaleable circuit elements; drawing the non-scaleable elements using a CAD system; drawing an isolation region using the CAD system having a width $$W_{iso} = \frac{W_{min}}{1-P\%}$$

around the non-scaleable elements; and drawing the scaleable elements using the CAD system outside of the isolation region.

4. The method of claim 3 further comprising the step of: removing a first portion of the digital record corresponding to the non-scaleable elements from the digital record; processing the remaining portion of the digital record using a program in the CAD system to arithmetically shrink the remaining portion of the digital record corresponding to the scaleable elements including the isolation region; and placing first portion of the digital record corresponding to the the non-scaleable elements into the processed portion of the digital record corresponding to a location inside of the isolation region.

5. A method of laying out an integrated circuit having a first and a second type of circuitry using at least in part a programmed computer aided design (CAD) system, the method comprising:

generating a first generation digital record using a CAD system a first generation photomask wherein a first portion of the first generation mask corresponds to a first circuitry type, a second portion of the first generation digital record corresponds to an electrically inactive buffer zone surrounding the first circuitry type, and a third portion of the first generation digital record corresponds to a second circuitry type placed outside of the buffer zone; and generating a second generation digital record using the CAD system thereby providing the basis of a second generation photomask by processing the second and third portions of the first generation digital record corresponding to the buffer zone using a program on the CAD system to arithmetically shrink the buffer zone and the second circuitry type of the first generation digital record while not processing the first portion of the first generation digital record corresponding to the first circuitry type.

6. The method of claim 5 wherein the first circuitry type comprises bipolar transistors and the second circuitry type comprises CMOS transistors.

7. A method of laying out an integrated circuit having a first and a second type of circuitry using at least in part a programmed computer aided design (CAD) system, the method comprising:

generating a first generation digital record that provides a basis of a first generation photomask, wherein generating the first generation mask further comprises:

laying out a first circuitry type using a CAD system;

laying out a first buffer zone using the CAD system, wherein the first buffer zone is of a first width, is void of circuitry, and uniformly surrounds the first circuitry type;

laying out a second circuitry type outside of the buffer zone using the CAD system; and laying out a second buffer zone of a second width using the CAD system wherein the Second buffer zone is void of circuitry and uniformly surrounds the second circuitry type.

8. The method of claim 16 further comprising the step of: generating a first intermediate digital record by removing data corresponding to the first circuitry type from the first generation digital record; generating a second intermediate digital record by down scaling the second circuitry type and the first and second buffer zones by processing a remaining portion of the first generation digital record with a program in the CAD system; and generating a second generation digital record by replacing the data corresponding to the first circuitry type into the second intermediate digital records, wherein the second generation digital record provides a basis for a second generation photomask.

9. The method of claim 8 wherein the first buffer zone width of the second generation photomask is $W_{min}$, the second circuitry type and the first and second buffer zones are down scaled by P%, and the buffer zone width of the first generation photomask is at least $W_{min}/1-P\%$.

10. The method of claim 7 wherein the first buffer zone is an isolation region surrounding the first type of circuitry.

11. The method of claim 10 wherein the first circuitry type is bipolar and the second circuitry type is CMOS.

* * * * *